United States Patent [19]

Sieverin

[11] 4,371,837
[45] Feb. 1, 1983

[54] TEMPERATURE COMPENSATED INPUT POWER AND OUTPUT OFFSET CIRCUITS FOR A HALL EFFECT TRANSDUCER

[75] Inventor: Walter J. Sieverin, McHenry, Ill.

[73] Assignee: American Can Company, Greenwich, Conn.

[21] Appl. No.: 93,885

[22] Filed: Nov. 13, 1979

[51] Int. Cl.³ ............... G01R 33/06; G01N 27/72; H03K 17/90; H03K 19/08
[52] U.S. Cl. ..................... 324/225; 324/251; 307/309
[58] Field of Search ............ 324/225, 224, 251; 307/309–310

[56] References Cited

U.S. PATENT DOCUMENTS

| | | | |
|---|---|---|---|
| 3,008,083 | 11/1961 | Kuhrt et al. | 324/251 |
| 3,320,520 | 5/1967 | Pear, Jr. | 324/251 |
| 3,597,679 | 8/1971 | Habfast | 324/251 |
| 3,816,766 | 6/1974 | Anselmo et al. | 307/309 |

OTHER PUBLICATIONS

Mins, "Hall Effect Magnetic Sensor", Popular Electronics, 1979, pp. 96–97.

Primary Examiner—Gerard R. Strecker
Assistant Examiner—Walter E. Snow
Attorney, Agent, or Firm—Paul R. Audet; Stuart S. Bowie; Aaron Passman

[57] ABSTRACT

A temperature compensating circuit for taking into account operating temperature changes of a Hall effect transducer to compensate for Hall output DC offset changes using a resistance circuit including a thermistor for offset feedback control of an operational amplifier in accordance with varying temperature. The circuit also includes a load response input portion to power the Hall effect transducer to compensate for Hall gain change versus temperature.

5 Claims, 5 Drawing Figures

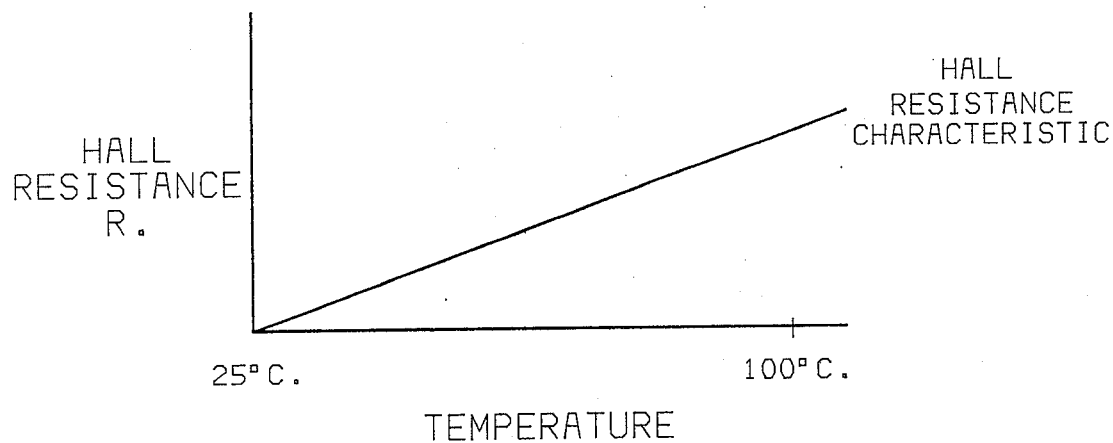
FIG. 4
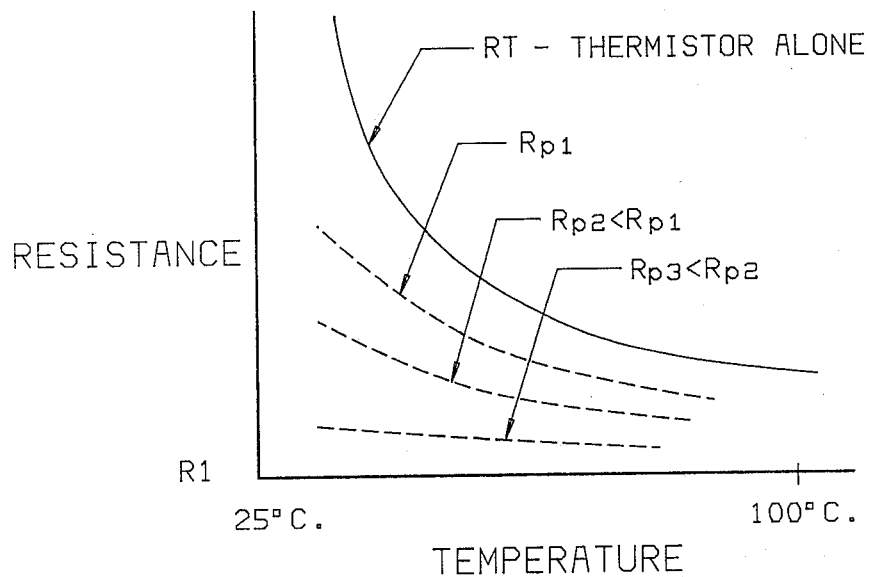
FIG. 5
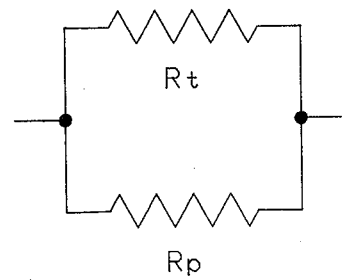

TEMPERATURE COMPENSATED INPUT POWER AND OUTPUT OFFSET CIRCUITS FOR A HALL EFFECT TRANSDUCER

BACKGROUND OF THE INVENTION

This invention relates to an apparatus for measuring the relative energy consumed during a welding process and, in particular, covers an apparatus to be used as a transducer in connection with a Soudronic welder adapted to weld the longitudinal side seam of a thin metal can body. Soudronic welders for this type of application have a secondary transformer rating of 4 to 8 volts and 5000 amps. The welding is pulse-type at high frequency and can be in the range of 50 to 900 Hz with each alternating waveform producing a power pulse. A travelling electrode being a copper wire is positioned between the surfaces to be welded and the output terminals of the secondary winding for the welding transformer. The copper wire is used between each of the electrodes and the metal surface to be welded and is moved after each welding pulse in order to prevent deterioration of the welding electrodes.

Can bodies are generally hollow cylindrical constructions which are formed along a longitudinal edge into a closed cylinder leaving both ends open. The meeting edges of the cylinder thus formed from a flat blank of material are overlapped for purposes of welding. The blanks are preferably fashioned from preprinted (lithography) tinplate or tin free steel chrome-type such as MRT3 having a 0.25 ETP on the surfaces. Such material can range from 65 to 112 pound plate weight ber base box which represents a range of 0.007" to 0.0123" in thickness depending upon the application of the container to be formed from the tinplate and/or tin free steel chrome-type. A welded side seam is preferable to other forms of side seams such as a soldered can seam or a glued together joint. More particularly, in aerosol containers which must be capable of withstanding up to 200 pounds per square inch of internal pressure, a welded longitudinal side seam has a great many advantages. Similarly, in containers which are of a particular configuration which is too large to be drawn (as, for example, a two-piece container is), a welded side seam gives the requisite strength and simplifies the manufacture of such containers as they are too long or too large for drawing. In other applications it is important to have lithograph information on the exterior surface of the containers. Quality lithography cannot be applied at high-speed to a preformed drawn container so a container with a manufactured side seam is required.

Hall effect devices have been used in connection with a number of transducer applications some of which have been applied to welding machines see, for example Noth U.S. Pat. No. 3,240,961; Hill U.S. Pat. No. 3,194,939; Barnhart et al U.S. Pat. No. 3,335,258 and Treppa et al U.S. Pat. No. 3,389,239. Each of the foregoing is designed to use a Hall device in combination with a welder for purposes of current determination. Similarly, the Hood U.S. Pat. No. 3,365,665 shows a Hall transducer which has been used in a system for measuring current flow in high voltage conductors e.g. power lines. The Hood patent is particularly interesting in that the problems wrought by temperature changes are recognized and correction is made for Hall gain versus temperature. The circuit of Hood does not automatically compensate for the Hall DC offset versus temperature at zero magnetic field. The mentioned prior art patents use the Hall effect device to sense varying magnetic fields during weldings. Hood also recognizes that such devices are sensitive to current and voltage input as well as ambient temperature, but such outside influences can be adjusted to be respectively small with respect to the signal put out by the Hall effect transducer in connection with the application disclosed in the prior art.

In a high-speed operation such as welding thin metal can bodies at several hundred per minute with an alternating current welder, the influences of input current and voltage as well as ambient temperature becomes significant when one is trying to measure small changes in the welder operating conditions. It is, therefore, the function of the circuit herein to completely compensate for the aforesaid conditions in an effort to provide a Hall effect transducer which will be useful in monitoring the energy used to weld the side seam of a thin metal container and same will be set forth in the following summary.

SUMMARY OF THE INVENTION

The improved transducer provided by the invention employs a conventional Hall effect device as is known in the prior art. Such a device includes a magnetic field responsive plate preferably of semiconductor material. The plate has two input supply terminals and two output electrodes. When input power is supplied to the plate terminals and the device is subjected to a magnetic field output voltage is generated across the output electrodes. The output voltage is proportional to the magnetic field and, therefore, is a measure of the strength of the field and the energy from which it eminates (i.e. the power used between welding electrodes). It has been known in the past welder monitors to use Hall effect devices to measure current flow and to otherwise measure voltage across the welder electrodes However, the use of such a device in combination with a high frequency alternating current welder to measure small relative changes in operating conditions presents considerable difficulties. More particularly, the input power for the Hall effect device must vary with ambient temperature as well as compensation for DC offset versus temperature at zero magnetic field. The Hall effect device exhibit a linear signal variation with increasing temperature when powered by a constant current or voltage source. More particularly, the signal tends to vary in opposite directions with increase in temperature at constant voltage or constant current and such divergence may be used to balance each other by use of an appropriate resistance such as shown in Hood. That solution is inadequate for detecting small variations in an alternating current welder and ignores the other difficulty of the Hall effect device and that is DC offset change versus temperature versus Hall power. More particularly, the Hall device has a linearly varying DC offset signal at the compensated gain and its resistance increases with temperature whereby even an adjusted input power will not completely correct for the Hall gain and DC offset simultaneously. The present invention includes a load responsive circuit in the form of a power supply adapted to compensate for the varying parameters which are a result of temperature differences. The power supply senses the input power terminal resistance and compensates with a corrected input current.

The supply circuit includes a light emitting diode (LED) used as a voltage reference source for the constant current source comprised of a transistor and current sensing resistor. The voltage versus temperature characteristic of the diode is used to compensate for the base to emitter negative temperature coefficient. The diode is arrange in series with a resistance such that current can flow to the Hall effect device as the sum of the constant current source plus the current flowing through the diode. Consequently, the series resistance can be selected such that a minor portion of the operating current for the Hall effect device is carried through the diode with the major portion supplied by the constant current source. As the Hall effect device resistance increases with increased operating temperature, the current flowing through the diode decreases. The Hall device signal gain versus temperature can be compensated for by proper selection of a resistance in series between the power supply and the diode.

The DC offset voltage of the Hall effect device increases or decreases with increase or decrease in temperature. This is corrected by providing a thermistor attached to the Hall effect device which senses the Hall element temperature. In addition to the thermistor there is an adjustable potentiometer for use in setting the initial Hall and amplifier offset voltage to zero. The thermistor is in parallel with a resistance and in series with the potentiometer to linearize the response within the desired temperature compensation range utilizing the amplifier offset terminals. As the temperature of the Hall effect device increases, the resistance of the thermistor decreases thus changing the offset balance of the amplifier circuit inversely to the Hall signal change being inputed to the amplifier. Similarly, as the temperature decreases, the converse is true.

It is, therefore, an object of the present invention to provide a circuit which compensates for the Hall DC offset signal change at varying temperatures.

It is a further object of the present invention to provide a circuit which compensates for changing Hall device voltage gain with changing temperature.

It is still a further object of this invention to provide a circuit in which the change in the Hall effect device resistance is used to compensate the Hall gain with respect to a change in temperature.

It is yet another object of this invention to provide a circuit which is simple, reliable, low cost with capabilities of detecting small signal variations in the presence of fluctuating operating temperatures and varying magnetic fields for monitoring the welding of a side seam for metal container bodies.

BRIEF DESCRIPTION OF THE DRAWINGS

FIG. 4 is a graphical depiction illustrating the change in Hall effect power input terminal resistance with respect to the change in temperature of the ambient condition about the Hall effect device, and FIG. 5 is a graphical depiction of the response of a thermistor with respect to changes in ambient temperature.

DETAILED DESCRIPTION OF THE DRAWINGS

Figure 1:
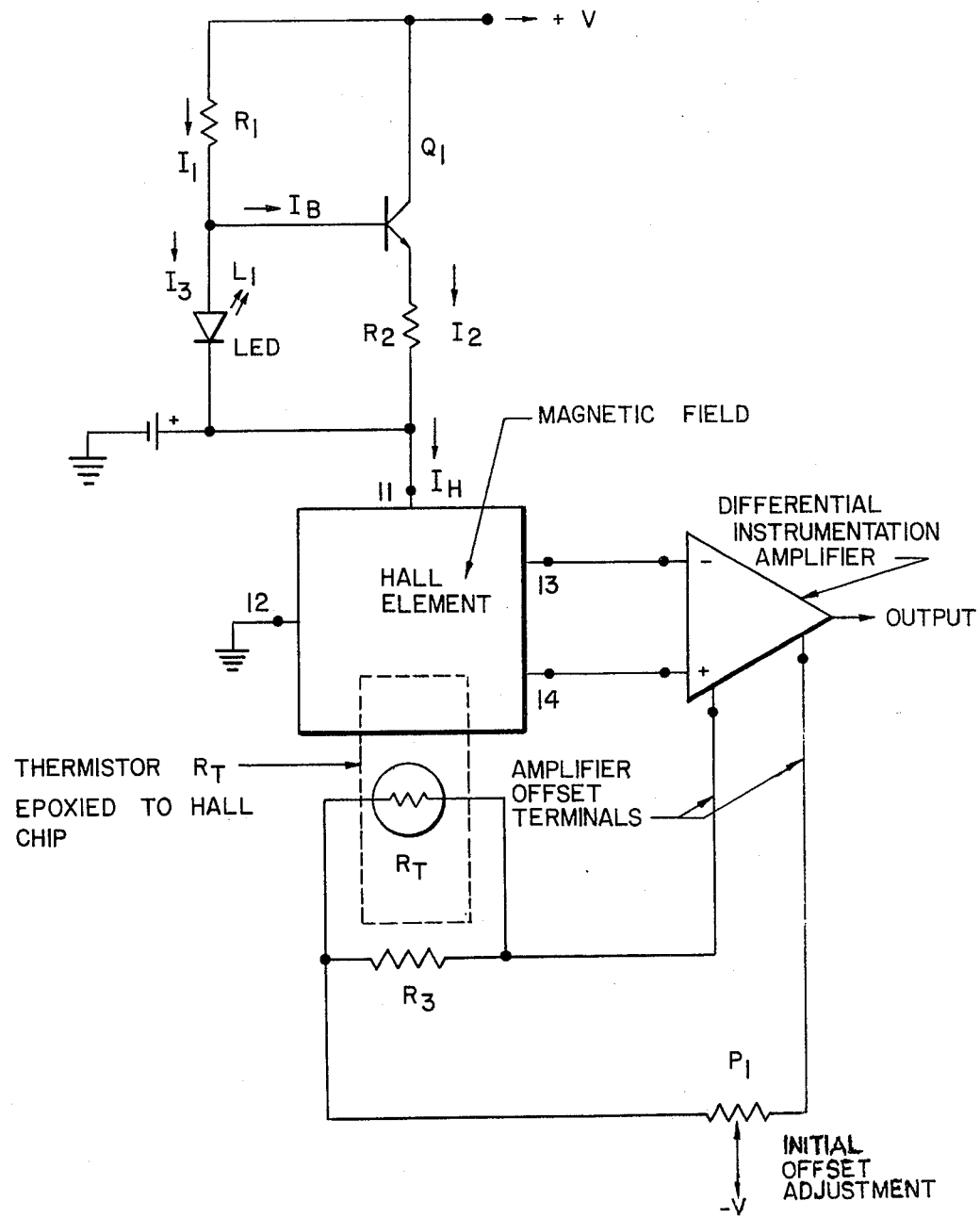
FIG. 1 is a schematic circuit diagram showing the Hall effect device as it is connected to its power input source and its output amplifier and the compensating offset circuitry.

In FIG. 1, the circuit for the temperature compensation of the magnetic field sensing Hall element is shown. It includes the power input portion for the Hall element which is designed to compensate for changes in gain (FIG. 2), with respect to changing temperatures as well as changes in Hall element resistance with respect to temperature (FIG. 4). The power input circuit is connected to the Hall element at terminal 11 and provides a DC voltage source adjusted in accordance with the stated compensatory objectives. More particularly, there is a voltage source, indicated at the top as V+, which is connected in series through a resistor $R_1$ to the base terminal of a transistor $Q_1$ and to the diode. The resistor $R_1$ establishes a current $I_1$ flowing through that leg of the circuit from the DC voltage source. The leg with current $I_1$ is connected to the base of transistor $Q_1$ and to a light emitting diode $L_1$ whereby the forward voltage drops across the light emitting diode $L_1$ is used to establish a reference voltage source for the transistor $Q_1$ and current sensing resistor $R_2$. The light emitting diode $L_1$ has a voltage change with respect to temperature which compensates for the negative temperature coefficient of transistor $Q_1$. The light emitting diode $L_1$ is connected at its other end through a damping condensor to ground, to current sensing resistor $R_2$ and to the input terminal 11 of the Hall element.

Figure 2:
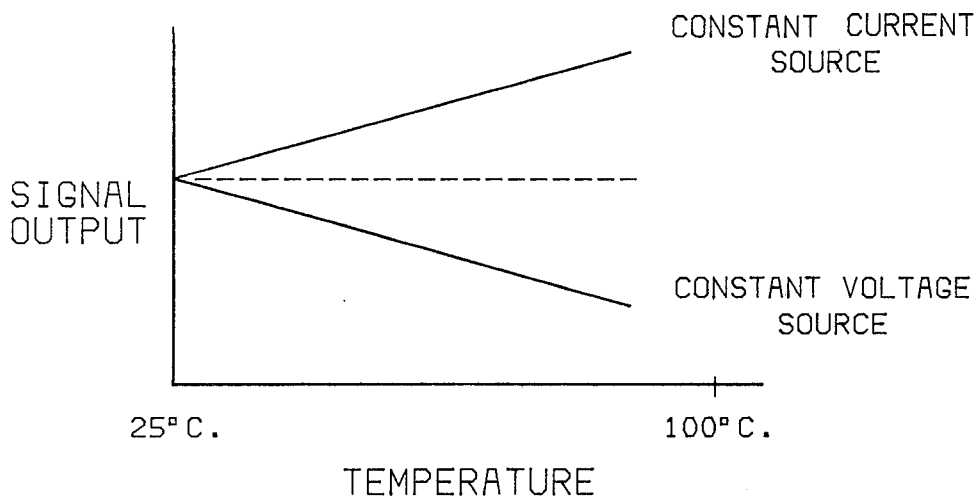
FIG. 2 is a graphical depiction illustrating a change in output signal relative to ambient temperature of the Hall effect device.

A resistor $R_2$ is connected between the collector of the transistor $Q_1$ in parallel with the light emitting diode $L_1$ and in series with the input terminal 11 of the Hall element. Consequently, the current $I_H$ flowing to the Hall element is the combination of the currents $I_2+I_3$ which flow through the light emitting diode $L_1$ and resistor $R_2$ respectively. The resistor $R_1$ plus the internal Hall element resistance as sensed at terminal 11 (with respect to grounded terminal 12) by the load responsive input circuit determines the operating current $I_3$ since current $I_2$ remains constant (it being a function of the operative control of the transistor $Q_1$). As the Hall element resistance increase with increasing operating temperature (FIG. 4), the current $I_3$ decreases. Proper selection of $R_1$ will give a controlled change in current $I_3$ as necessary to compensate for the Hall element increase of signal gain with respect to temperature (FIG. 2).

The Hall signal outputs at terminals 13 and 14 are connected respectively to the negative and positive inputs of the differential instrumentation amplifier.

Figure 3:
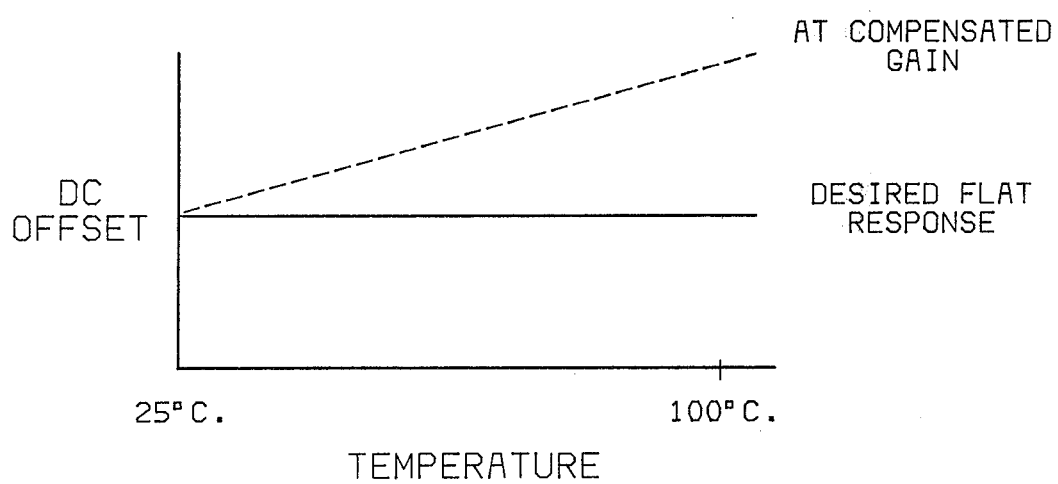
FIG. 3 is a graphical depiction illustrating the change in DC offset gain with respect to changes in ambient temperature about the Hall effect device.

The magnetic field to which the Hall element is subjected is noted on FIG. 1 and represents the influence of pulsing welded current upon the Hall element. Shown below the Hall element is the thermistor $R_T$ which in the preferred embodiment is cemented directly to the Hall element chip. This thermistor is connected in parallel with a resistor $R_3$ and both are connected in series to a potentiometer $P_1$ whereby the other connection from the combination of thermistor $R_T$ and resistor $R_3$ is connected to one control terminal of the amplifier. These control terminals are labelled in FIG. 1, amplifier offset terminals and control the amplifier output offset voltage. More particularly, the initial DC offset signal output from the Hall element at terminals 13 and 14, as supplied to the differential instrumentation amplifier, is nulled by setting the initial offset potentiometer $P_1$. Note that as the Hall operating temperature increases or decreases, the output of the DC offset is proportionately increased or decreased, see FIG. 3. This change in offset is supplied to the differential instrumentation amplifier through terminals 13 and 14, but the amplifier will also receive an inverse control signal from the thermistor circuit for temperature compensation. When the DC offset voltage increases at the output terminals 13 and 14, a companion increase in operating temperature of the Hall element is sensed by the thermistor $R_T$ which is in thermal contact with the Hall element such that the resistance of the thermistor $R_T$ decreases per FIG. 5. The parallel circuit of thermistor $R_T$ and resistor $R_3$ cooperate to provide a linearized signal to the differential instrumentation amplifier which signal is proportional to the change in the Hall element temperature such that the differential instrumentation amplifier is adjusted and the signal received from the terminals 13 and 14 is compensated in the output signal from the differential instrumentation amplifier. In the event that the temperature of the Hall element decreases the resistance of the thermistor $R_T$ will increase and the circuit will adjust the amplifier accordingly.

The differential instrumentation amplifier operates in a manner well known to those skilled in the art in that it takes the difference of the signals from terminals 13 and 14 which are merely different levels of DC output fluctuating in accordance with the magnetic field. The differential instrumentation amplifier adjusts that DC voltage difference in response to the temperature as determined by the signal from the thermistor compensation circuit. Consequently, the output from the differential instrumentation amplifier is a DC voltage proportional to the magnetic field and not influenced in any way by the temperature. The output signal can be connected to a measuring and/or recording device and to a controlling device for the Soudronic welder whereby increases in welding power are instantaneously recorded and/or adjusted. The fact that the operation and response of this system is automatic allows its use in connection with high-speed (several hundred can bodies per minute) welding of extremely thin metal in a production operation for forming container bodies.

Those skilled in the instrumentation and control of production equipment arts will no doubt appreciate small refinements and changes in the components of the power input circuit and the temperature compensating output circuit over that herein described. It is, therefore, sought to be covered by the claims which follow all circuitries which recognize the various parameters effected by temperature change noted herein and compensated heretofore by the specific circuits shown.

What is claimed is:

1. A temperature and offset voltage compensating circuit for a Hall effect transducer comprising:

a supply circuit means connected between a power source and the power supply input of a Hall effect transducer including a constant current source and a load responsive voltage reference source for adjusting the overall current available to said transducer in accordance with changes in gain and input power resistance as a result of temperature change while being responsive to small changes in magnetic field, where said supply circuit means being responsive to resistance changes of said transducer as a function of temperature to vary and adjust input power to said transducer in accordance with changes in resistance thereof and to prevent any changes in signal output gain due to transducer resistance fluctuations; and an output circuit means connected to the output of said Hall effect transducer and having a temperature responsive thermistor as part of a control system for feeding a differential amplifier in said system and connected to the output of said transducer and a thermistor adjacent said transducer in circuit with an adjustable resistance for zeroing the initial offset of said transducer and linearizing the signal of said thermistor to provide a controlling input from said thermistor to said amplifier for correcting said Hall effect output in accordance with ambient temperature changes at said transducer.

2. The temperature compensating circuit of claim 1 wherein said constant current source is the operative elements of a transistor with a resistor in series with the emitters of said transistor and the base of said transistor being supplied by a voltage reference source responsive to the base to emitter negative temperature coefficient of said transistor.

3. The temperature compensating circuit of claim 2 wherein said voltage reference source is a diode in series with a resistance connected at end to said power source and at the other to said base and said diode for permitting additional current to flow to said transducer as a function of the power input resistance thereof.

4. The temperature compensating circuit of claim 3 wherein said diode is a light emitting diode with voltage versus temperature characteristics that compensate for the base to emitter negative temperature coefficient.

5. The temperature compensating circuit of claim 2 wherein said temperature responsive control system includes a differential amplifier connected to the output of said transducer and a thermistor adjacent said transducer in circuit with an adjustable resistance for zeroing the initial offset of said transducer and linearizing the signal of said thermistor to provide a controlling input from said thermistor to said amplifier.

* * * * *